(12) United States Patent
Ngwar

(10) Patent No.: US 11,190,165 B1
(45) Date of Patent: Nov. 30, 2021

(54) WIDEBAND LOW POWER ACTIVE ISOLATOR

(71) Applicant: Melin Ngwar, Ottawa (CA)

(72) Inventor: Melin Ngwar, Ottawa (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/067,522

(22) Filed: Oct. 9, 2020

(51) Int. Cl.
  *H03H 11/38* (2006.01)
  *H03H 11/28* (2006.01)

(52) U.S. Cl.
  CPC .............. *H03H 11/38* (2013.01); *H03H 11/28* (2013.01)

(58) Field of Classification Search
  None
  See application file for complete search history.

(56) References Cited

U.S. PATENT DOCUMENTS

| | | | | |
|---|---|---|---|---|
| 4,908,531 A | * | 3/1990 | Podell ................ | H03K 17/6871 327/409 |
| 5,087,898 A | * | 2/1992 | Pyndiah ................ | H03H 11/52 327/427 |

OTHER PUBLICATIONS

J. Chang, J. Kao, Y. Lin, H. Wang, "Design and Analysis of 24-GHz Active Isolator and Quasi-Circulator", IEEE Transactions on Microwave Theory and Techniques, Aug. 2015, pp. 2638-2648, vol. 63, No. 8.
F. Ali, A. Podell, "A Wide-Band Push-Pull GaAs Monolithic Active Isolator", IEEE Microwave and Guided Wave Letters, Feb. 1991, pp. 26-27, vol. 1, No. 2.
D.G. Haigh, "Wideband active microwave isolators using GaAs MMIC technology", IEEE Proceedings—Microwave Antennas and Propagation, Apr. 1996, pp. 179-183, vol. 143, No. 2.

* cited by examiner

*Primary Examiner* — Cassandra F Cox
(74) *Attorney, Agent, or Firm* — Ridout and Maybee LLP

(57) ABSTRACT

A wideband low power active isolator that may operate with a low voltage supply and provide improved linearity and insertion loss is described. The active isolator includes parallel connected common gate amplifier and common drain amplifier that are implemented using active transistors. A RF choke configured to suppress RF signal is coupled between input to the common gate amplifier and the ground such that the common gate amplifier also functions as a current source biasing the common drain amplifier.

15 Claims, 8 Drawing Sheets

WIDEBAND LOW POWER ACTIVE ISOLATOR

TECHNICAL FIELD

The present disclosure relates to electronic circuits, and in particular active isolators for radio frequency (RF) circuits.

BACKGROUND

Typically, cascaded components of RF systems introduce impedance mismatch that may cause in-band amplitude and phase ripple, and reduced gain. Accordingly, to ameliorate the ill effects of impedance mismatch, impedance transformation are needed for maximum power transfer within the system. Impedance transformation can be achieved with matching networks or isolators. In integrated circuits (IC)'s where passive components commonly used in matching networks are typically more lossy, isolators may be the preferred choice for impedance transformation.

An isolator may be a passive device implemented from a ferrite three-port circulator where one of the ports is terminated with matched impedance. However, for high frequency applications, such as those in the hundred-gigahertz range, the size of the magnets and ferrites becomes unworkable and very costly. With the advent of semiconductor technology, it is now feasible to construct compact active isolators that are well suited for RF applications at the expense of power consumption. Additionally, in order to achieve compact integration with wideband performance, active isolators with low power consumption are preferable to their passive counterparts.

The current technological trend towards smaller circuitry requires smaller transistors with lower breakdown voltages to operate at lower voltages, particularly as supply voltages are tending to decrease (e.g., to 1V or less). Current isolator topologies may require higher supply voltage to maintain transistors in desired operating conditions and at low power supplies may result in degraded power loss and linearity, or alternatively they rely on passive elements that render circuits larger in size and lossy with poor bandwidth.

Accordingly, there is a need for an improved active isolator having wideband performance with improved linearity and less power loss at low power supplies.

SUMMARY OF THE INVENTION

In one aspect, the present disclosure provides an active isolator circuit having an input and an output, the active isolator circuit comprising: a first transistor configured as a common gate amplifier; a second transistor configured as a common drain amplifier, wherein the common gate amplifier and the common drain amplifier are parallel connected between the input and the output; and a RF signal blocking device coupled between an input terminal of the common gate amplifier and a ground, the RF signal blocking device configured to suppress RF signals such that the common gate amplifier also functions as a current source biasing the common drain amplifier via an output terminal.

In another aspect, the present disclosure provides a method of providing an active isolator circuit, the method comprising: providing a first transistor configured as a common gate amplifier; providing a second transistor configured as a common drain amplifier, parallel connecting the common gate amplifier and the common drain amplifier between an input of the active isolator circuit and an output of the active isolator circuit; and connecting an RF signal blocking device between the input of the active isolator circuit and a ground, the RF signal blocking device being configured such that the common gate amplifier also functions as a current source biasing the common drain amplifier.

In any of the above aspects, a source of the first transistor and a gate of the second transistor may be coupled to the input to receive an input signal; and a drain of the first transistor and a source of the second transistor may be coupled to the output to produce an output signal.

In any of the above aspects, a gate of the first transistor may be biased with a first DC voltage source, and the gate of the second transistor is biased with a second DC voltage source.

In any of the above aspects, the RF signal blocking device may be a degenerative inductor.

In any of the above aspects, the degenerative inductor may be configured such that a self-resonance frequency value of the degenerative inductor is twice a maximum operating frequency value.

In any of the above aspects, the degenerative inductor may be one of a planar spiral, air core, iron core, ferrite core, Bobbin-based, toroidal core, gapped core, cut core, and multi-core inductor.

In any of the above aspects, the gate of the second transistor may be coupled to the input through a DC blocking capacitor.

In any of the above aspects, the RF signal blocking device may be a part of an input impedance matching network.

In any of the above aspects, the first DC voltage source and the second DC voltage source may be equal to a DC power supply of VDD.

In any of the above aspects, the first and second transistors may be powered by a DC voltage supply VDD of 1V or less.

Any of the above aspects may further comprise biasing a gate of the first transistor with a DC voltage source; and biasing a gate of the second transistor with a DC voltage source.

Any of the above aspects may further comprise providing an input impedance matching network that includes the RF signal blocking device.

Any of the above aspects may further comprise coupling a gate of the second transistor to the input through a DC blocking capacitor.

Any of the above aspects may further comprise implementing the RF signal blocking device with a degenerative inductor. At least some of the above aspects may advantageously provide an active isolator for wideband performance that exhibits improved linearity and capable of operating at lower power supply with less loss.

BRIEF DESCRIPTION OF THE DRAWINGS

Similar reference numerals may have been used in different figures to denote similar components.

DESCRIPTION OF EXAMPLE EMBODIMENTS

An isolator is typically a two-port device that allows RF energy to pass unidirectionally from one port to the next with unity gain and little insertion loss but prevents signal reflection in the reverse direction with a high isolation. Accordingly, isolators are well suited for impedance transformation by minimizing signal reflection typically found between cascaded components that have different impedances commonly found in various multi-state communication devices, including wired or wireless communication devices.

Figure 1:
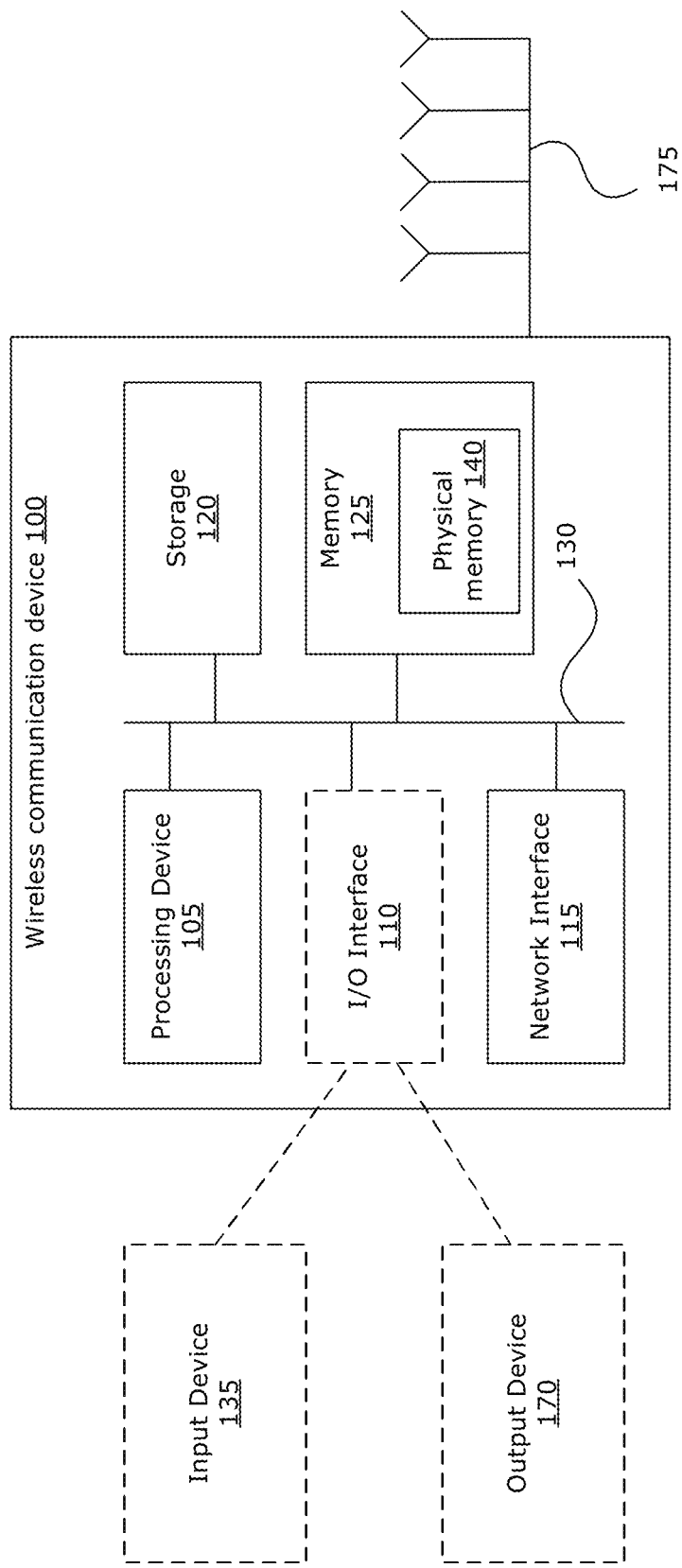
FIG. 1 shows a schematic diagram of an example wireless communication device in which example isolators described herein may be used.

FIG. 1 shows a schematic diagram of an example wireless communication device 100, in which example isolators described herein may be used. Examples of the isolators described herein may be used in cascaded circuitry components such as filter(s), amplifier(s), and splitter(s) of the wireless communication device 100. For example, the wireless communication device 100 may be an electronic device, such as a user equipment (UE) or a base station, in a wireless communication network. The wireless communication device 100 may be used for communications within 5G communication networks or other wireless communication networks. Other communication devices (including communication devices for wired or wireless communications) may also be suitable for implementing examples described herein, and which may include components different from those described with respect to FIG. 1. Although FIG. 1 shows a single instance of each component, there may be multiple instances of each component in the wireless communication device 100. The wireless communication device 100 may be implemented using parallel and/or distributed architecture.

The wireless communication device 100 may include one or more processing devices 105, such as a processor, a microprocessor, an application-specific integrated circuit (ASIC), a field-programmable gate array (FPGA), a dedicated logic circuitry, or combinations thereof. The wireless communication device 100 may also include one or more optional input/output (I/O) interfaces 110, which may enable interfacing with one or more optional input devices 135 and/or output devices 170. The wireless communication device 100 may include one or more network interfaces 115 for wired or wireless communication with a network (e.g., an intranet, the Internet, a P2P network, a WAN and/or a LAN, and/or a Radio Access Network (RAN)) or other node. The network interface(s) 115 may include one or more interfaces to wired networks and wireless networks. Wired networks may make use of wired links (e.g., Ethernet cable). Wireless networks, where they are used, may make use of wireless connections over a plurality of antennas 175. The network interface(s) 115 may provide wireless communication via one or more transmitters or transmit antennas and one or more receivers or receive antennas, for example. The network interface(s) 115 may further comprise circuitry including filter(s), amplifier(s), and splitters(s) to further process signals to be transmitted or received signals. An active isolator, as disclosed herein, may be used to provide impedance transformation in any cascaded circuitry components or multi-stage circuitry where impedance mismatch may be present. In this example, a plurality of antennas 175 is shown. The plurality of antennas 175 may serve as an antenna array. In other examples, the wireless communication device 100 may use one antenna 175, which may provide both receiving and transmitting functions. The wireless communication device 100 may also include one or more storage units 120, which may include a mass storage unit such as a solid state drive, a hard disk drive, a magnetic disk drive and/or an optical disk drive.

The wireless communication device 100 may include one or more memories 125 that can include a physical memory 140, which may include a volatile or non-volatile memory (e.g., a flash memory, a random access memory (RAM), and/or a read-only memory (ROM)). The non-transitory memory(ies) 125 (as well as storage 120) may store instructions for execution by the processing device(s) 105. The memory(ies) 125 may include other software instructions, such as for implementing an operating system (OS), and other applications/functions. In some examples, one or more data sets and/or modules may be provided by an external memory (e.g., an external drive in wired or wireless communication with the wireless communication device 100) or may be provided by a transitory or non-transitory computer-readable medium. Examples of non-transitory computer readable media include a RAM, a ROM, an erasable programmable ROM (EPROM), an electrically erasable programmable ROM (EEPROM), a flash memory, a CD-ROM, or other portable memory storage.

There may be a bus 130 providing communication among components of the wireless communication device 100. The bus 130 may be any suitable bus architecture including, for example, a memory bus, a peripheral bus or a video bus. Optional input device(s) 135 (e.g., a keyboard, a mouse, a microphone, a touchscreen, and/or a keypad) and optional output device(s) 170 (e.g., a display, a speaker and/or a printer) are shown as external to the wireless communication device 100, and connected to optional I/O interface 110. In other examples, one or more of the input device(s) 135 and/or the output device(s) 170 may be included as a component of the wireless communication device 100.

The isolator described herein may be included as a component of the wireless communication device 100, for example as a component of a cascaded filter, cascaded amplifier, or a cascaded splitter for receiving/transmitting wireless signals using the antennas 175.

Figure 2A:
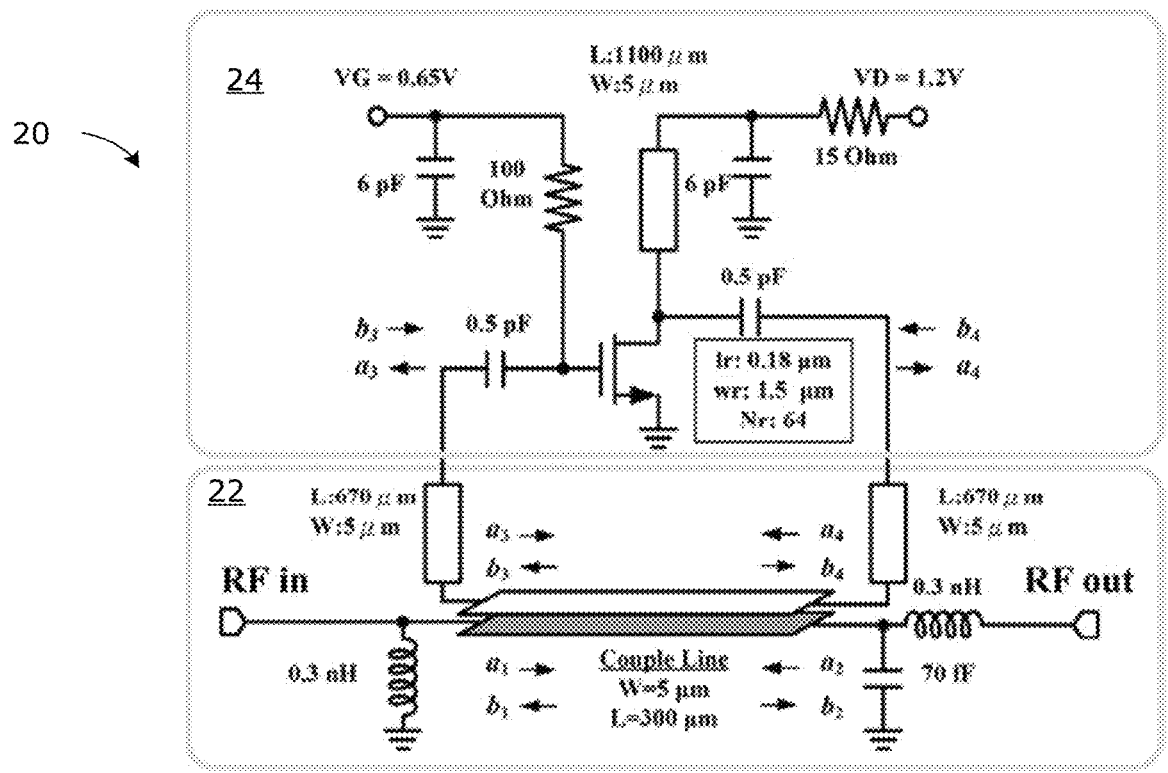
FIG. 2A shows a schematic diagram of a prior art hybrid isolator.

To assist in understanding the present disclosure, some examples of prior art isolator designs are discussed. Some of the existing architectures of active isolators uses a hybrid approach that incorporates both active and passive elements. FIG. 2A is a schematic diagram of an example prior art isolator 20, as described in "*Design and Analysis of 24-GHz Active Isolator and Quasi-Circulator*" by J. Chang et al. (IEEE Transactions on Microwave Theory and Techniques, August 2015, pp. 2638-2648, Vol. 63, No. 8), [Chang] the disclosure of which is expressly incorporated by reference in its entirety. In this example, isolator 20 is a hybrid implementation using a passive directional coupler 22 for forward transmission and active common source (CS) amplifier 24 for reverse isolation.

Figure 2B:
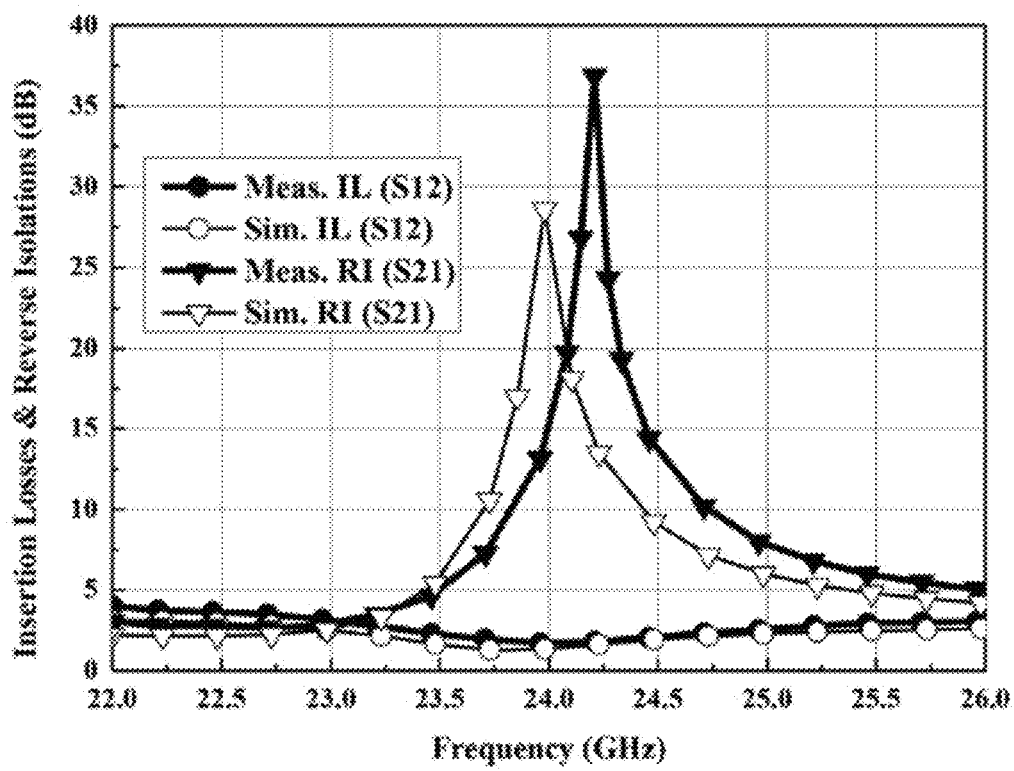
FIG. 2B shows a plot of measured and simulated narrowband insertion loss and reverse isolation of the isolator in FIG. 2A.

As can be appreciated, with the presence of a single transistor means the isolator circuit presented in Chang may be compatible with low power supply. In Chang, it was disclosed a 1.5 μm transistor biased at 1.2V $V_{ds}$ with a $V_{gs}$ of 0.65V was selected to implement the CS amplifier 24. However, the disclosed hybrid isolator exhibits narrow fractional bandwidth. FIG. 2B (FIG. 16(a) of Chang) is a plot of measured and simulated narrowband insertion loss and reverse isolation of isolator 20. As may be observed from FIG. 2B, at a center frequency of 24.2 GHz, the frequency bandwidth with 20 dB reverse isolation is about 250 MHz (~1%). The bandwidth with 15 dB isolation is approximately 500 MHz, or approximately 2%. Additionally, the disclosed hybrid isolator 20 may also suffer from higher cost of fabrication and increased size due to the presence of the passive elements including the 670 μm×5 μm directional coupler 22.

Figure 3A:
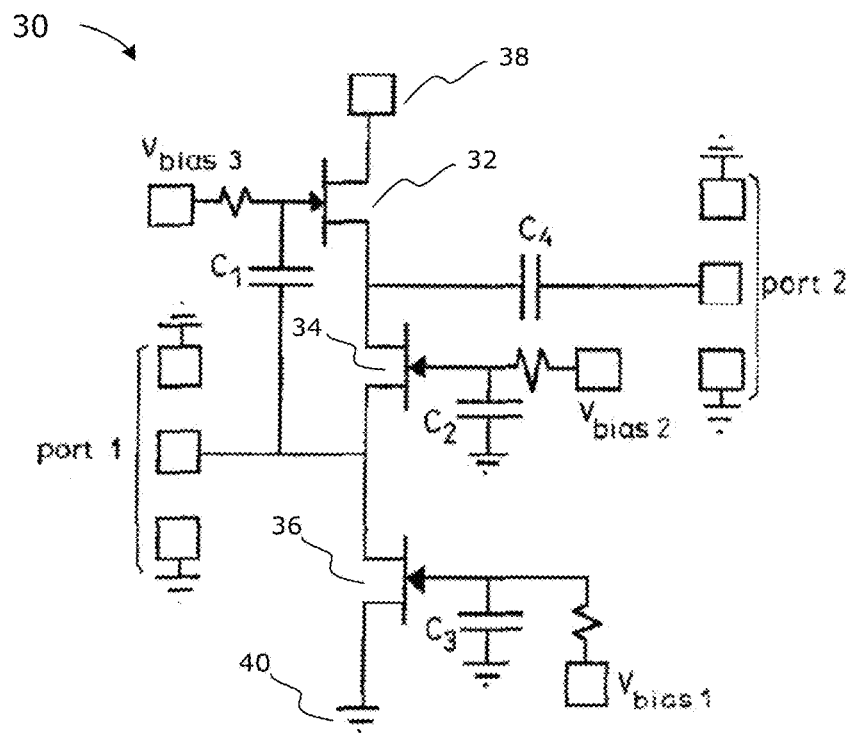
FIG. 3A shows a schematic diagram of a prior art active isolator.
Figure 3B:
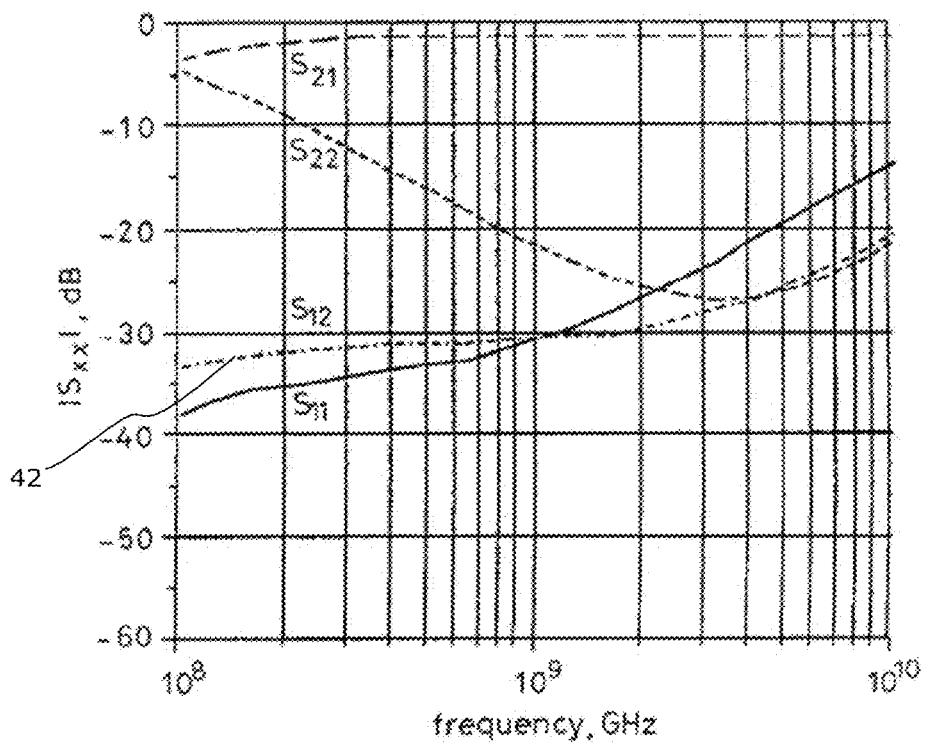
FIG. 3B shows a S-parameter simulation plot of the isolator in FIG. 3A.

Other isolator circuits may use multiple (e.g. three or more) transistors which require a higher power supply in order to maintain the transistors in desired operating conditions. FIG. 3A is a schematic diagram of an example prior art isolator 30, as described in "*Wideband active microwave isolators using GaAs MMIC technology*" by D. G. Haigh (IEEE Proceedings-Microwave Antennas and Propagation, April 1996, pp. 179-183, Vol. 143, No. 2.) [Haigh], herein expressly incorporated by reference in its entirety. In this example, three FET transistors 32, 34, and 36 are configured in a stacked configuration between a 6V supply voltage 38 and a ground 40. The prior art isolator exhibits wideband capability as the −3 dB bandwidth of the isolator 30 may be discerned from the $S_{12}$ plot 42 in FIG. 3B, which shows the S-parameter simulation plot of the isolator 30.

However, current technological trend towards smaller circuitry using smaller transistors means lower breakdown voltages and operating at lower voltages, particularly as supply voltages are tending to decrease (e.g., 0.55V for 14 nanometer (nm) processes and below). Transistors in the above incorporated reference may have insufficient headroom to maintain the transistors in the desired operating conditions, which in turn may result in degraded power loss and linearity. For example, for a 0.55V power supply each of the three stacked transistors may be operating at a knee voltage of 0.23V in the triode region for higher current, where the knee voltage is defined as the value of $V_{DS}$ beyond which the drain current $I_D$ no longer increase linearly to the increase of $V_{DS}$. Operating at the knee voltage or triode region may exacerbates the degradation in linearity and power loss of the device.

Figure 4:
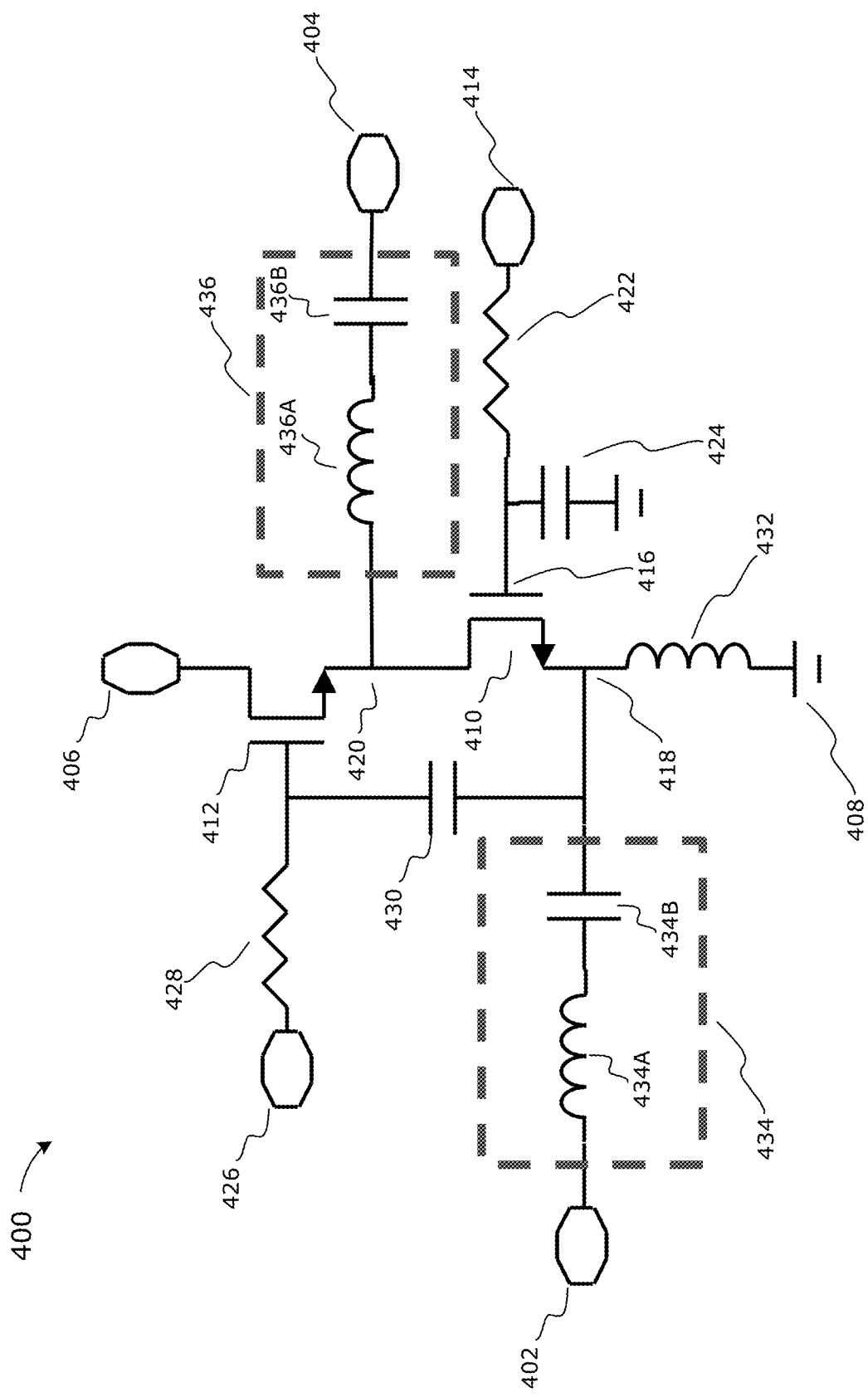
FIG. 4 shows a schematic diagram of an example disclosed active isolator.

FIG. 4 is a schematic diagram of an example disclosed wideband low power active isolator 400 in accordance with the present disclosure, which may address at least some of the drawbacks of the prior art isolators discussed above. In the illustrated embodiment, the isolator 400 is operably coupled between an input terminal 402 and an output terminal 404. The isolator 400 is connected between positive supply voltage $V_{DD}$ 406 and negative supply voltage or ground 408. The $V_{DD}$ 406 may be dependent on the IC process. By way of non-limiting examples, a 28 nm process IC may operate with a $V_{DD}$ of 1.0V. As another example, a 14 nm process IC may operate with a $V_{DD}$ 0.55V supply voltage. As it may be understood by a person skilled in the art, the IC process dictates the size of the transistor, and hence the threshold voltage ($V_{th}$) of the transistor, which is defined as the minimum gate-to-source voltage $V_{GS}$ that is needed to create a conducting path between the source and drain terminals. By way of non-limiting examples, the $V_{th}$ for some 14 nm process IC and some 28 nm process IC may be 0.35V and 0.42V, respectively.

The isolator 400 comprises a first transistor 410 and a second transistor 412. Although example embodiments described herein may comprise field effect transistors (FETs), it is to be understood that other embodiments of the circuit described herein may comprise bipolar transistors or high electron mobility transistors (HEMT's), complementary metal-oxide-semiconductor (CMOS), or any other similar devices.

In the illustrated embodiment, the first transistor 410 is configured as a common-gate (CG) amplifier where the gate terminal is coupled to a first direct current (DC) bias voltage source $V_{bias1}$ 414 at node 416. As shown, the input terminal 402 is coupled to the source terminal of the transistor 410 at node 418 and the output terminal 404 is coupled to the drain terminal of the transistor 410 at node 420.

The DC voltage source $V_{bias1}$ 414 serves as an alternating current (AC) ground. The $V_{bias1}$ 414 may ensure the first transistor 410 remains in the saturation region of the transistor. Further, as the gate voltage of the transistor 410, the $V_{bias1}$ 414 is responsible for setting the $I_{DS}$ current value passing through the first transistor 410 from its drain terminal to its source terminal. Thus, the first transistor 410 effectively functions as a current source to the source terminal of the second transistor 412 as $I_{DS}$ of the first transistor sets the current to the source terminal of the second transistor 412 at node 420. In some embodiments, the $V_{bias1}$ 414 is of the same voltage value as the $V_{DD}$ 406. In some other embodiments, Vbias1 414 may be determined in accordance with Equation (1):

$$V_{bias1} = V_{th1} 2 I_{bias} R_{in} \qquad \text{Equation (1)}$$

Where $V_{th1}$ is the threshold voltage of transistor 410, $R_{in}$ is the input impedance as seen by the isolator 400, $I_{bias}$ is the biasing current, which, in some embodiments, is the $I_{DS}$ current of the first transistor. In some embodiments, the $I_{bias}$ may be application specific based on a power dissipation restriction.

In the illustrated embodiment, a resistance 422 represents the output resistance of the voltage source $V_{bias1}$ 414, which provides the biasing voltage. The value of resistance 422 may range from 1Ω to 100 kΩ.

A capacitor 424 is coupled between node 416 and the ground 408, which also serves as an AC ground. The capacitor 424 is configured to ensure that the gate terminal of the first transistor 410 of the common gate amplifier is at an AC ground, especially for large values of voltage source resistance 422 (i.e. greater than 10Ω). In some embodiments, the capacitance value of the capacitor 424 (C) is frequency dependent and may be determined as $$C \approx \frac{0.5}{2\pi f},$$

where f is the minimum operating frequency, for sufficient bypass to the ground 408 regardless of the value of resistance 422. In some embodiments, the capacitance of capacitor 424 may be decreased if the resistance 422 is small. In some embodiments, value of resistance 422 and capacitor 424 may be selected such that they satisfy Equation (2):

$$\left| R_{422} \| \frac{j}{2\pi f C_{424}} \right| < 2\Omega \qquad \text{Equation (2)}$$

In the illustrated embodiment, the second transistor 412 is configured as a common-drain (CD) amplifier where the gate terminal is coupled to a second bias DC voltage source $V_{bias2}$ 426. As shown, the drain terminal of the second transistor 412 is coupled to the supply voltage $V_{DD}$ 406. The source terminal of transistor 412 is coupled to the output terminal 404 via node 420.

The resistance 428 is the output resistance of the DC voltage source $V_{bias2}$ 426 that provides the DC bias voltage. Unlike resistance 422, resistance 428 is typically large to ensure that the AC signal applied to the gate of the transistor 412 is not shorted to ground. In some embodiments, the resistance 428 may have values of greater than 1 kΩ.

In some embodiments, the value of $V_{bias2}$ 426 falls within the following range to ensure that both transistors remain in the saturation mode of operation: $V_{gs2}+V_{gs1}-V_{th} < V_{bias2} \leq V_{DD}$, where $V_{gs1}$ and $V_{gs2}$ are the gate source voltages of the first (410) and second (412) transistors respectively, and $V_{th}$ is the threshold voltage which is identical for both transistors in the illustrated embodiment. This may ensure that both transistors remain in the saturation mode of operation. In some embodiments, with the $V_{bias2}$ may be the same voltage value as the $V_{DD}$ 406 since it would provide the highest voltage headroom for linearity operation for the CG transistor 410.

Generally, the biasing voltages from DC voltage sources 414 and 426 may be adjusted up to a maximum voltage that is equal to the supply voltage $V_{DD}$ 406 to ensure the transistors 410 and 412 are operating in the linear region and to vary the bias current of the transistors. By changing the supply voltage $V_{DD}$ 406 to the isolator 400, the maximum drain-source voltage ($V_{DS}$) of each of the FETs 406 and 408 may be increased or decreased, which may vary the operating region of the FETs depending on the process size. In some embodiments, the supply voltage $V_{DD}$ 406 is set to be the maximum voltage of the circuit in which the isolator 400 is implemented.

The gate terminal of the CD amplifier transistor 412 is coupled to the input 402 through a DC blocking capacitor 430. The capacitor 430 may allow the input signal from input 402 to be applied to both the CD and the CG transistors 410 and 412 while ensuring they are separately biased. The capacitance value of the capacitor 430 may also be frequency dependent. In some embodiments, the capacitance C of 430 is $$\approx \frac{0.5}{2\pi f},$$

where f is the minimum operating frequency.

As shown, the input, or source terminal of the CG amplifier transistor 410, and the input, or gate terminal the CD amplifier transistor 412, are both coupled to input 402 at node 418. The output, or the drain terminal of the CG amplifier transistor 410, along with the output, or the source terminal of the CD amplifier transistor 412, are both coupled to the output 404 through node 420. Thus, the transistors 410 and 412 are parallel connected between nodes 418 and 420, which may yield an ideal small-signal isolation characteristic. Specifically, an ideal small-signal isolator is practically a two-port network that may provide forward unity gain, reverse gain of zero, and perfect matching at both ports, which in terms of S and Y parameters may be expressed as follows:

$$S_i = \begin{bmatrix} 0 & 0 \\ 1 & 0 \end{bmatrix} \text{ and } Y_i = \begin{bmatrix} G_0 & 0 \\ -2G_0 & G_0 \end{bmatrix} \qquad \text{Equations (3)}$$

Where conductance $G_0$ may be 20 milli-Siemens (mS) assuming a 50Ω system. In cases where Equations (3) are implemented using transistors, the small signal currents at each of the transistor terminals, namely gate, source, and drain, may be approximated as:

$$I_d = \beta(V_{gs} - V_T)^2 \qquad \text{Equations (4)}$$
$$I_s = -I_d$$
$$I_g = 0$$

Where $I_d$, $I_s$, and $I_g$ are drain, source, and gate currents, respectively. Parameter Vgs is the gate-source voltage, β is a constant based on channel length, channel width, electron mobility $\mu_n$ and oxide capacitance $C_{ox}$, and $V_T$ is the threshold voltage of the transistor. For the purpose of small signal analysis, Equations (4) may be linearized and represented by the indefinite admittance matrix in Equation (5) below as:

$$\begin{bmatrix} i_g \\ i_s \\ i_d \end{bmatrix} = \begin{bmatrix} 0 & 0 & 0 \\ -G_m & G_m & 0 \\ G_m & -G_m & 0 \end{bmatrix} \begin{bmatrix} v_g \\ v_s \\ v_d \end{bmatrix} \qquad \text{Equation (5)}$$

Where $G_m$ is small-signal transconductance, which equals $i_d/v_{gs}$, which in turn equals $dI_d/dV_{gs}$. From Equation (5) above, the admittance matrix of the CG transistor, which has a grounded $v_g$ of 0, may be obtained by deleting the first row and the first column of the admittance matrix in Equation (5). Similarly, the admittance matrix of the CD transistor, which has a grounded $v_d$ of 0, may be obtained by deleting the third row and the third column of the admittance matrix in Equation (5). The resulting admittance matrices for the CG and CD transistors are expressed as follows:

$$Y_{CG} = \begin{bmatrix} G_m & 0 \\ -G_m & 0 \end{bmatrix} \text{ and } Y_{CD} = \begin{bmatrix} 0 & 0 \\ -G_m & G_m \end{bmatrix} \qquad \text{Equations (6)}$$

As may be observed, the admittance matrix for an isolator as expressed in Equations (3) may be realized by a parallel connected CG and CD transistors where $G_m=G_0$ for both transistors.

In the illustrated embodiment, an RF signal blocking device in the form of a degenerative inductor 432 is coupled between the node 418 and the ground 408 to prevent the input signal from input 402 from shorting into the ground 408. By presenting a high AC impedance, the degenerative inductor 432 may be configured as an RF choke, which chokes off or suppresses high-frequency AC signals, such as an RF input signal, and allows the passage of low frequency and DC signals. Hence, the input signal from input 402 is forced onto the input of the CG amplifier transistor 410.

Figure 5:
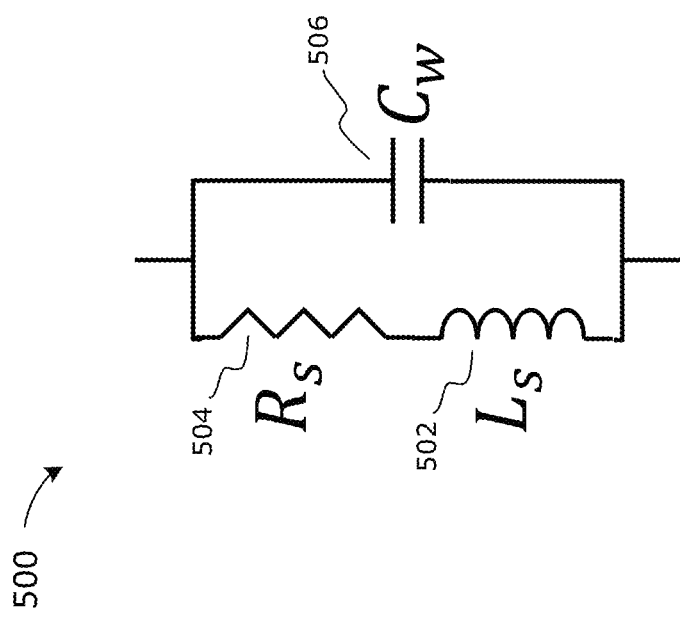
FIG. 5 shows a simplified planar spiral inductor model of the degenerative inductor in FIG. 4.

The inductance of the degenerative inductor 432 is dependent on the operating frequency range of the isolator 400. In the illustrated embodiment, the degenerative inductor 432 can be realistically modelled by a simplified planar spiral inductor model 500 shown in FIG. 5. In the inductor model 500, inductance 502 ($L_s$) is the desired inductance which may depend on the inner diameter, trace metal width, turn spacing, and number of turns of the degenerative inductor 432. Resistance 504 ($R_s$) is the parasitic resistance of the inductor which depends on the metal thickness, inductor length, and trace metal width of the degenerative inductor 432. Capacitance 506 ($C_s$) is a parasitic capacitance which depends on the trace metal width, metal thickness, turn spacing, and number of turns of the degenerative inductor 432. Based on the simplified model 500, the degenerative inductor 432 only behaves like an inductor up to its self-resonance frequency (SRF) after which its parasitic capacitance dominates its functionality. The SRF may be expressed as per Equation (7):

$$SRF = 2f_{max} = \frac{1}{2\pi\sqrt{L_s C_w}} \quad \text{Equation (7)}$$

Where $f_{max}$ is the maximum operation frequency. Based on Equation (7), the value of the RF signal blocking device may be characterized in terms of its SRF as follows:

$$L_s = \frac{1}{16\pi^2 f_{max}^2 C_w} \quad \text{Equation (8)}$$

It is to be understood that the value of parasitic capacitance 506 ($C_w$) may vary depending on IC process parameters such as metal thickness, minimum trace metal width, and minimum turn spacing. Further, other parameters including the number of turns in an inductor coil may be dependent on specific inductor designs. Consequently, the value of the parasitic capacitance 506 ($C_w$) varies depending the IC process being used and the specific inductor design. In some embodiments, the value of the RF blocking device can be universally set in any IC process by increasing the value of $L_s$ 502, which may result in an increased associated parasitic capacitance $C_w$ until the combination of $L_s$ and $C_w$ yield a SRF value that is approximately twice the value of maximum operating frequency $f_{max}$. By way of a non-limiting example, for an operating bandwidth between 30 GHz and 60 GHz, the degenerative inductor 432 may be 300 nH for use in combination with a 28 nm-process IC.

In some embodiments where minimal sizing is preferred, the degenerative inductor 432 may be kept to the minimum value that is sufficient to block RF signals in the operating frequency band. Any suitable types of inductors, including planar spiral, air core, iron core, ferrite core, Bobbin-based, toroidal core, gapped core, cut core, multi-core, may be used to implement the degenerative inductor 432. It is to be understood that although a degenerative inductor 432 is described herein, any other RF signal blocking device may also be used to implement the RF choke.

Input impedance matching network 434 and output impedance matching networking 436 are configured to provide impedance matching between the isolator 400 and its input signal source (not shown) and its output load (not shown), respectively, to avoid impedance mismatch and any resulting return/reflection losses with the input device and output load. The impedance matching networks 434 and 436 may each include a combination of one or more inductors (434A, 436A) and one or more capacitors (434B, 436B) as shown in FIG. 4. In some embodiments, the input and output impedance matching networks 434 and 436 may include one or more series inductors, parallel capacitors, or any other suitable configuration. In some embodiments, the degenerative inductor 432 may be seen from the input and may form part of the input impedance matching network 434.

Figure 6:
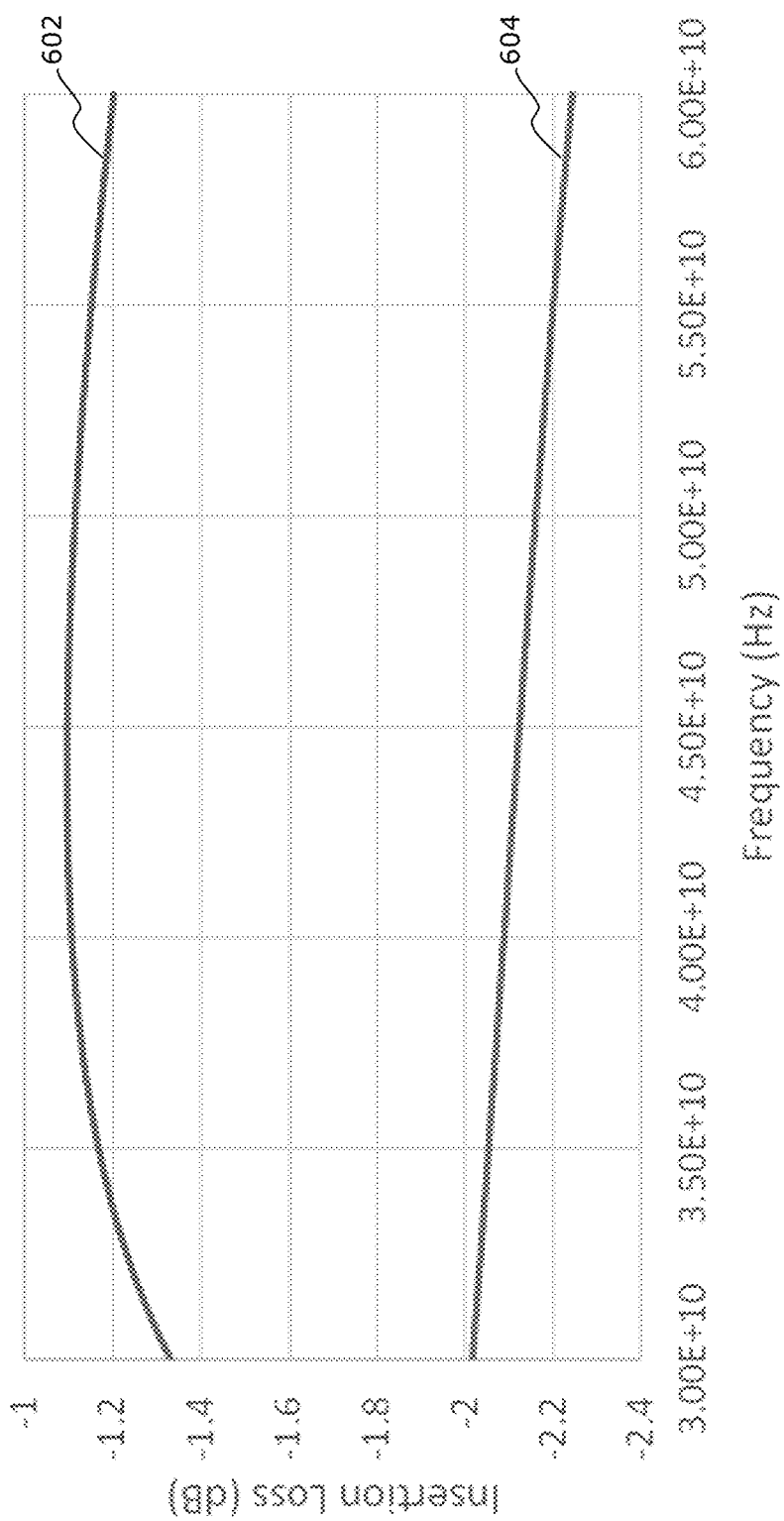
FIG. 6 shows simulated insertion loss plots of the isolator in FIG. 4 compared to that of the isolator in FIG. 3A.

FIG. 6 shows simulated insertion loss plots of the isolator 400 compared to that of isolator 30 of FIG. 3A. As may be observed in FIG. 6, in the frequency band of 30 GHz to 60 GHz, the insertion loss plot 602 of the isolator 400 exhibits, on average, approximately a 0.9 dB improvement when compared to the insertion loss plot 604 of the isolator 30. Insertion loss measures the amount of signal loss by comparing the input signal power to the output signal power. Thus, having a better insertion loss profile means that the isolator 400 is less lossy than isolator 30.

Figure 7:
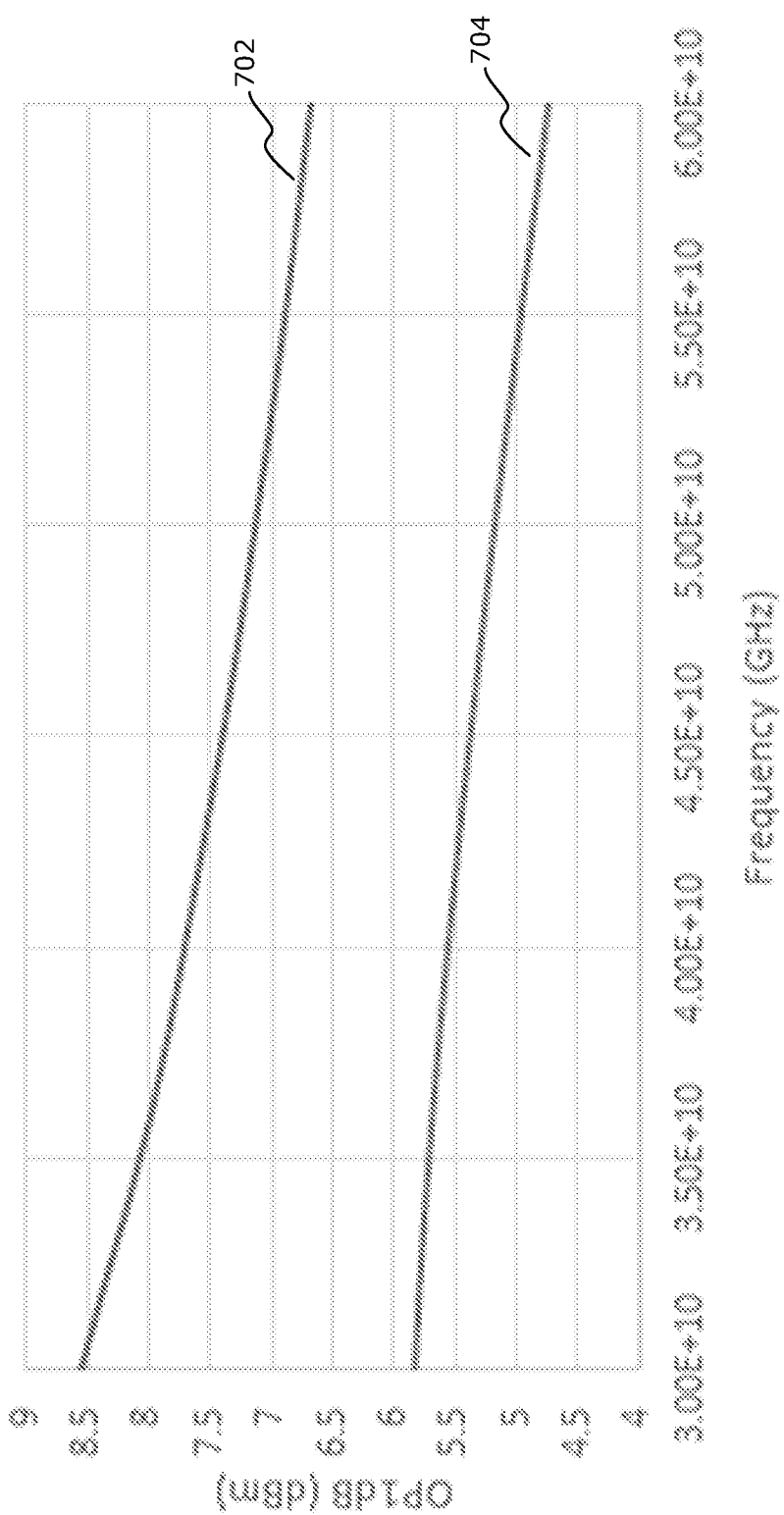
FIG. 7 shows simulated OP1dB plots of the isolator in FIG. 4 compared to that of the isolator in FIG. 3A.

FIG. 7 shows simulated plots of the 1 dB output compression point (OP1dB) of the isolator 400 compared to that of isolator 30 of FIG. 3A. The OP1dB is defined as the output power level at which the gain decreases 1 dB from its constant value. When the gain compression exceeds 1 dB, the circuit may be said to no longer exhibit linearity. As may be observed in FIG. 6, in the frequency band of 30 GHz to 60 GHz, the OP1dB plot 702 of the isolator 400 exhibits, on average, approximately a 2.5 dB higher OP1dB when compared to the OP1dB plot 704 of the isolator 30. In other words, the isolator 400 has increased linearity.

Figure 8:
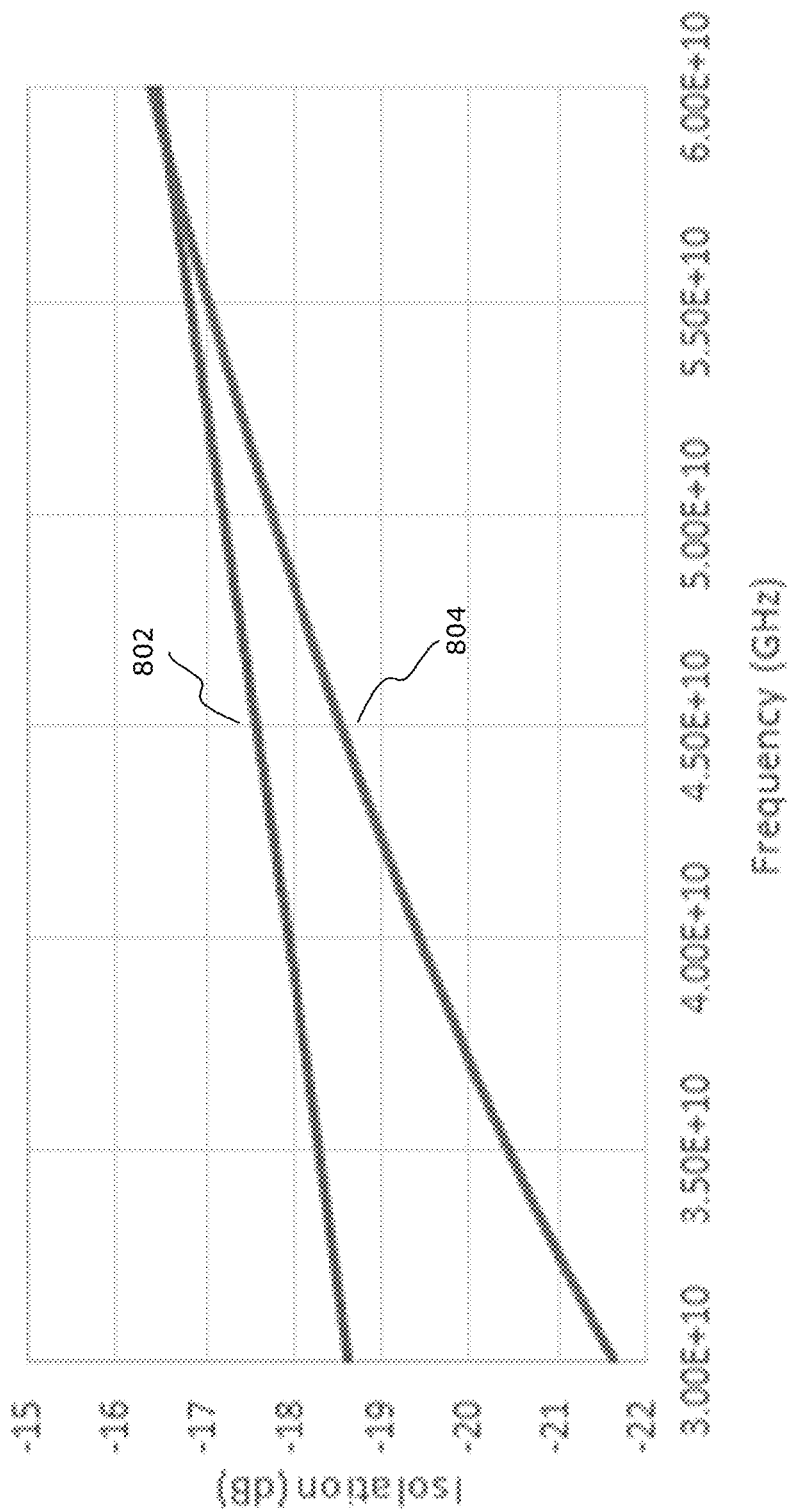
FIG. 8 shows simulated isolation plots of the isolator in FIG. 4 compared to that of the isolator in FIG. 3A.

FIG. 8 shows simulated isolation plots of the isolator 400 compared to that of isolator 30 of FIG. 3A. As may be observed in FIG. 8, the isolation 802 of the isolator 400 is approximately 1 dB worse at the center frequency (i.e. approximately 45 GHz) compared to isolation 804 of isolator 30. In some embodiments, a 1 dB lower isolation may result in a power loss of approximately 0.016 dB, which may be an acceptable tradeoff given the improvement in linearity and insertion loss described above. As it may be observed, the rate of isolation degradation as a result of increasing frequency is lower for isolator 400 compared to that of isolator 30 to the point where isolator 400 exhibits slightly higher isolation than isolator 30 towards the upper bound of the octave bandwidth near 60 GHz.

Accordingly, the disclosed active isolator may provide increased linearity by having a higher output OP1dB compared to at least some of the prior art isolators.

Additionally, the disclosed active isolator may provide a lower insertion loss at least in part due to the transistors employed therein operating within the saturation region of the transistors.

Furthermore, the effective complexity, which is a measure of the information content of the regularities of the disclosed active isolator, may remain unchanged from at least some of the prior art isolators, such as isolator 30 in FIG. 3A. This is at least in part due to the removal of an active component (i.e. a transistor) and the addition of a passive element (i.e. a degenerative inductor).

In some example embodiments, the disclosed active isolator may have low power consumption compared to that of the prior art isolators. By way of an example, using 28 nm process IC's with a 1V $V_{DD}$, power consumption of the disclosed active isolator may be approximately 1 mW. Accordingly, at least some embodiments of the disclosed active isolator may be suitable for use in mobile electronic devices, such as cellular handsets, to isolate mismatched components with a minimal battery usage penalty.

In some example embodiments, the disclosed active isolator may provide improved linearity, decreased insertion loss, and comparable isolation in the 30 GHz to 60 GHz wide frequency band.

In some example embodiments, the disclosed active isolator may provide improved linearity, decreased insertion loss, and comparable isolation in wide frequency band while operating with 1V or less $V_{DD}$ power supply.

Although the present disclosure describes methods and processes with action in a certain order, one or more actions of the methods and processes may be omitted or altered as appropriate. One or more actions may take place in an order other than that in which they are described, as appropriate.

Although the present disclosure is described, at least in part, in terms of methods, a person of ordinary skill in the art will understand that the present disclosure is also directed to the various components for performing at least some of the aspects and features of the described methods, be it by way of hardware components, software or any combination of the two. Accordingly, the technical solution of the present disclosure may be embodied in the form of a software product. A suitable software product may be stored in a pre-recorded storage device or other similar non-volatile or non-transitory computer readable medium, including DVDs, CD-ROMs, USB flash disk, a removable hard disk, or other storage media, for example. The software product includes instructions tangibly stored thereon that enable a processing device (e.g., a personal computer, a server, or a network device) to execute examples of the methods disclosed herein.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure.

All values and sub-ranges within disclosed ranges are also disclosed. Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The invention claimed is:

1. An active isolator circuit having an input and an output, the active isolator circuit comprising:
a first transistor configured as a common gate amplifier;
a second transistor configured as a common drain amplifier,
wherein the common gate amplifier and the common drain amplifier are parallel connected between the input and the output; and
a RF signal blocking device coupled between an input terminal of the common gate amplifier and a ground, the RF signal blocking device configured to suppress RF signals such that the common gate amplifier also functions as a current source biasing the common drain amplifier via an output terminal.

2. The active isolator circuit of claim 1, wherein
a source of the first transistor and a gate of the second transistor are coupled to the input to receive an input signal; and
a drain of the first transistor and a source of the second transistor are coupled to the output to produce an output signal.

3. The active isolator circuit of claim 2, wherein a gate of the first transistor is biased with a first DC voltage source, and the gate of the second transistor is biased with a second DC voltage source.

4. The active isolator circuit of claim 1, wherein the RF signal blocking device is a degenerative inductor.

5. The active isolator circuit of claim 4, wherein the degenerative inductor is configured such that a self-resonance frequency value of the degenerative inductor is twice a maximum operating frequency value.

6. The active isolator circuit of claim 4, wherein the degenerative inductor is one of a planar spiral, air core, iron core, ferrite core, Bobbin-based, toroidal core, gapped core, cut core, and multi-core inductor.

7. The active isolator circuit of claim 2, wherein the gate of the second transistor is coupled to the input through a DC blocking capacitor.

8. The active isolator circuit of claim 1, wherein the RF signal blocking device is a part of an input impedance matching network.

9. The active isolator circuit of claim 3, wherein the first DC voltage source and the second DC voltage source are equal to a DC power supply of $V_{DD}$.

10. The active isolator circuit of claim 9, wherein the first and second transistors are powered by a DC voltage supply $V_{DD}$ of 1V or less.

11. A method of providing an active isolator circuit, the method comprising:
providing a first transistor configured as a common gate amplifier;
providing a second transistor configured as a common drain amplifier,
parallel connecting the common gate amplifier and the common drain amplifier between an input of the active isolator circuit and an output of the active isolator circuit; and
connecting an RF signal blocking device between the input of the active isolator circuit and a ground, the RF signal blocking device being configured such that the common gate amplifier also functions as a current source biasing the common drain amplifier.

12. The method of claim 11, further comprising
biasing a gate of the first transistor with a DC voltage source; and
biasing a gate of the second transistor with a DC voltage source.

13. The method of claim 11, further comprising providing an input impedance matching network that includes the RF signal blocking device.

14. The method of claim 11, further comprising coupling a gate of the second transistor to the input through a DC blocking capacitor.

15. The method of claim 11, further comprising implementing the RF signal blocking device with a degenerative inductor.

* * * * *